(12) United States Patent
Sawahata et al.

(10) Patent No.: US 6,501,077 B1
(45) Date of Patent: Dec. 31, 2002

(54) SCANNING ELECTRON MICROSCOPE

(75) Inventors: Tetsuya Sawahata; Mitsugu Sato, both of Hitachinaka; Yoichi Ose, Mito, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/462,769
(22) PCT Filed: Sep. 25, 1998
(86) PCT No.: PCT/JP98/04297
§ 371 (c)(1),
(2), (4) Date: Jan. 13, 2000
(87) PCT Pub. No.: WO00/19482
PCT Pub. Date: Apr. 6, 2000

(51) Int. Cl.$^7$ .......................... H01J 37/141; H01J 37/244
(52) U.S. Cl. ............. 250/310; 250/396 R; 250/396 ML; 250/397; 250/311
(58) Field of Search ................................. 250/310, 311, 250/396 R, 397, 396 ML

(56) References Cited

U.S. PATENT DOCUMENTS

| | | | |
|---|---|---|---|
| 5,466,940 A | 11/1995 | Litman et al. ............... | 250/397 |
| 5,608,218 A | * 3/1997 | Sato et al. .................... | 250/310 |
| 5,644,132 A | 7/1997 | Litman et al. ............... | 250/310 |
| 5,872,358 A | 2/1999 | Todokoro et al. ........... | 250/310 |
| 6,043,491 A | * 3/2000 | Ose et al. .................... | 250/310 |
| 2001/0010357 A1 | * 8/2001 | Ose et al. .................... | 250/311 |

FOREIGN PATENT DOCUMENTS

| | | |
|---|---|---|
| JP | 57-46856 | 8/1955 |
| JP | 6-267484 | 9/1994 |
| JP | 7-192679 | 7/1995 |
| JP | 7-240168 | 9/1995 |
| JP | 8-264149 | 10/1996 |
| JP | 8-273569 | 10/1996 |
| JP | 9-171791 | 6/1997 |

\* cited by examiner

Primary Examiner—Bruce Anderson
Assistant Examiner—Nikita Wells
(74) Attorney, Agent, or Firm—Kenyon & Kenyon

(57) ABSTRACT

A scanning electron microscope which obtains a two-dimensional scan image of a sample includes an electron source and a scan deflector for scanning a primary electron ray generated from said electron source onto the sample. An objective lens forms a focusing magnetic field onto the sample, such as to surround the sample, the focusing magnetic field focusing the primary electron ray. A secondary signal detector for deflecting and detecting a secondary signal generated from the sample by irradiation of the primary electron ray obtains secondary electrons from a secondary electron conversion electrode for generating secondary electrons by collision of electrons, which is disposed between the objective lens and the detector at a location that is closer to the electron source than the objective lens is and at a location that is closer to the sample than the secondary signal detector is.

14 Claims, 5 Drawing Sheets

SCANNING ELECTRON MICROSCOPE

TECHNICAL FIELD

The present invention relates to electron ray apparatuses and more particularly to a scanning electron microscope where secondary electrons generated from a sample and reflective electrons are detected at high efficiency and images with high resolving power and high contrast are obtained favorably.

BACKGROUND ART

A scanning electron microscope is such that electrons emitted from an electron source are accelerated and are focused by an electrostatic lens or a magnetic field type lens to make a narrow beam of electrons (primary electron ray); the primary electron ray is scanned onto a sample to be observed using a scan deflector; a secondary signal generated secondarily from the sample by irradiation of the primary electron ray is detected; intensity of the detected signal is made a brightness modulation input of a cathode ray tube which is scanned in synchronization with the scanning of the primary electron beam; and thereby a two-dimensional scan image can be obtained.

The secondary signal generated from the sample by the irradiation of the primary electron ray has wide energy distribution. For example, the primary electrons impinging on the sample are subjected to elastic scattering by atoms on the surface of the solid and some electrons leave the surface of the sample. These are called reflective electrons and have energy equivalent to the primary electron ray or considerably high energy. Also the primary electrons impinging on the sample mutually act with atoms within the sample, and the electrons within the sample are excited and obtain the kinetic energy so that some electrons are emitted to the outside. These are called secondary electrons and have energy in a range from 0 eV to about 50 eV.

Japanese Patent Laid-open No. Hei 7-192679 discloses a technique that using a deflector for deflecting the secondary signal outward from the axis, orbits for the secondary electron and the reflective electron are separated and detectors are arranged on the orbits respectively whereby the secondary electron and the reflective electron can be detected selectively.

Also Japanese Patent Laid-open No. Hei 9-171791 discloses a technique that a reflecting plate provided with an aperture allowing an electron ray to pass therethrough is installed on upper side of a secondary electron detector, and reflective electrons colliding with the reflecting plate are converted into secondary electrons and detected.

Also Japanese Patent Laid-open No. Hei 8-273569 discloses a technique that divided annular detectors are installed on upper side of an objective lens, and secondary electrons and reflective electrons are separated from each other and detected utilizing the focusing function of the objective lens.

According to the techniques disclosed in these references, the secondary electrons and the reflective electrons having different orbits can be detected individually or in combination due to difference of the energy.

The reflective electron or the secondary electron has inherent information individually due to difference of generating cause. According to the techniques disclosed in the above-mentioned references, the reflective electron or the secondary electron can be detected selectively and thereby the sample image based on the inherent information can be formed.

DISCLOSURE OF INVENTION

According to the techniques disclosed in the above-mentioned references, while the secondary electron or the reflective electron can be detected individually or in combination, there are following problems.

In Japanese Patent Laid-open No. Hei 7-192679, the respective detectors or reflecting plates are arranged on the orbits for the secondary electron and the reflective electron, and the secondary electron and the reflective electron are detected selectively. Regarding the detection of the reflective electrons, however, the electrons only reflected substantially along the optical axis of the primary electron ray are detected but the reflective electrons generated from the sample at a low angle can not be detected.

This problem applies also to the reflective electron detection technique by the reflecting plate disclosed in Japanese Patent Laid-open No. Hei 9-171791. Also in this case, the electrons only reflected substantially along the optical axis are detected but the reflective electrons generated from the sample at a low angle can not be detected.

Also according to the technique disclosed in Japanese Patent Laid-open No. Hei 8-273569, secondary electrons are raised by an objective lens (electrostatic objective lens), and orbits for the secondary electron and the reflective electron are separated by the focusing function of an objective lens (magnetic objective lens) to detect the electrons. However, since a detector has a detecting surface in the vertical direction to the optical axis of the electron ray, the detecting surface can not be enlarged. Consequently a problem exists in that it is difficult to detect reflective electrons generated at a low angle, reflective electrons generated at a high angle or secondary electrons in discrimination.

Also in any of the objective lenses disclosed in the three references as above described, a lens gap (gap between magnetic poles) is formed toward the vertical direction to the optical axis of the primary electron ray. As a result, a problem exists in that the distance between the lens main surface and the sample (focal length) becomes long.

In order to solve the above-mentioned problems, an object of the present invention is to provide a scanning electron microscope where reflective electrons generated from a sample at a low angle can be detected without lengthening the focal length.

In order to attain the foregoing object, the present invention provides a scanning electron microscope which obtains a two-dimensional scan image of a sample, comprising: an electron source; a scan deflector for scanning a primary electron ray generated from the electron source onto the sample; an objective lens for forming a focusing magnetic field onto the surface of the sample, said focusing magnetic field focusing the primary electron ray; and a secondary signal detector for detecting a secondary signal generated from the sample by irradiation of the primary electron ray, characterized in that electrodes generating secondary electrons are arranged between the objective lens and the secondary electron detector.

According to the above-mentioned constitution, among secondary signals generated by the irradiation of the primary electron ray, a secondary signal generated from the sample at a low angle can be determined.

BEST MODE FOR CARRYING OUT THE INVENTION

Figure 1:
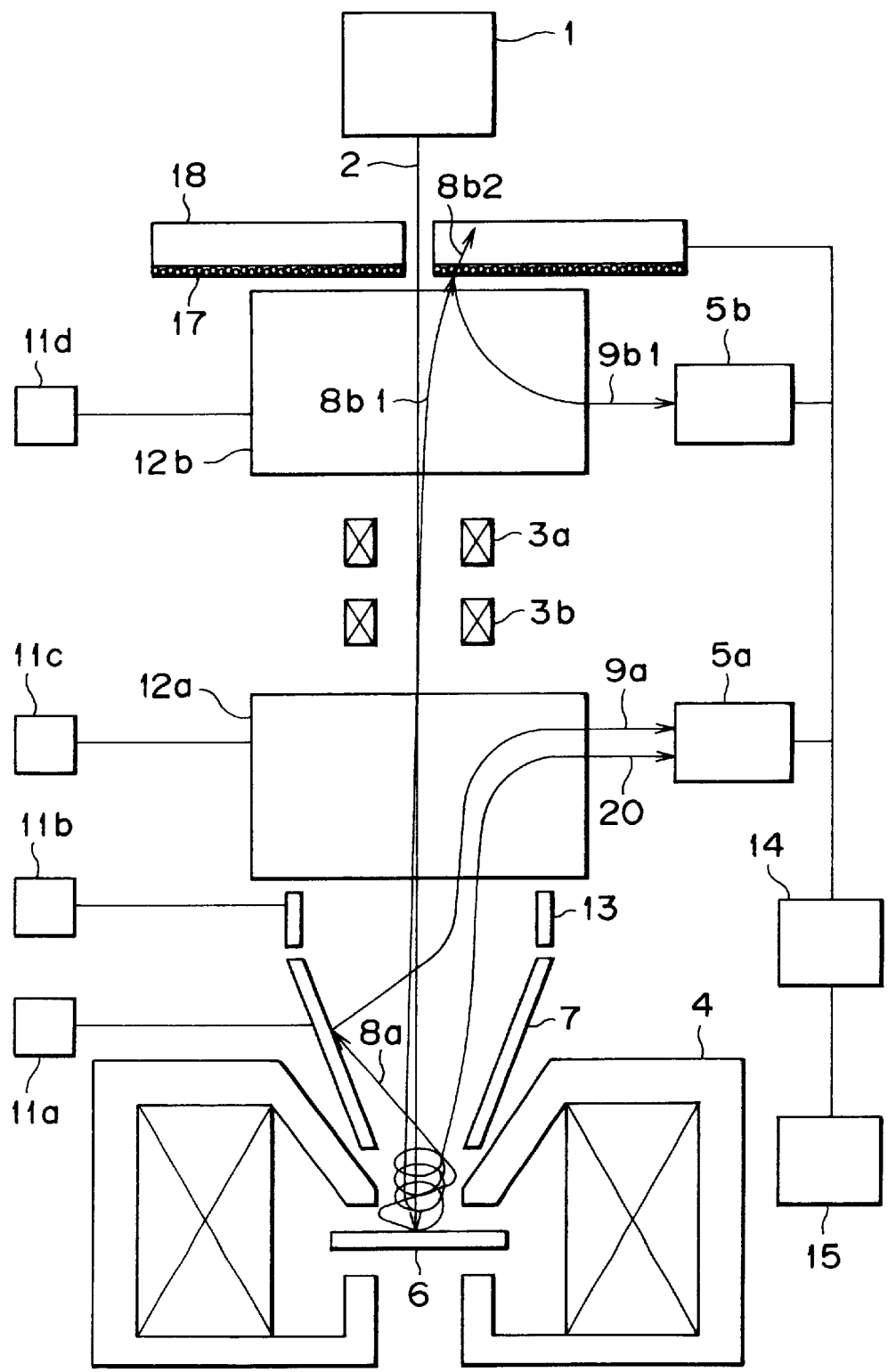
FIG. 1 is a schematic diagram of an embodiment of the invention showing a scanning electron microscope having an objective lens of in-lens type.

In the present invention, reflective electrons generated from a sample at a low angle can be detected, because a focusing magnetic field of an objective lens is formed on the surface of the sample, and a secondary electron conversion electrode (reflecting plate) is arranged between the objective lens and the secondary electron detector.

According to the scanning electron microscope in such constitution, reflective electrons reflected from a sample at a low angle make a spiral orbit by the focusing function of the objective lens. The conversion electrode for converting reflective electrons is arranged on the orbit and the reflective electrons reflected from the sample at a low angle are converted into secondary electrons whereby the reflective electrons generated from the sample at a low angle can be detected by the secondary electron detector.

On the other hand, any of the secondary electron conversion electrode and the reflective electron disclosed in Japanese Patent Laid-open No. Hei 7-192679 and Japanese Patent Laid-open No. Hei 9-171791 is arranged on the secondary electron detector (electron source side). As a result, a large gap is produced between the surface of the sample and the secondary electron conversion electrode or the reflective electron detector, and reflective electrons generated from the sample at a low angle can not be caught.

Also in any of the objective lens disclosed in these references, a gap between magnetic poles (lens gap) is opened toward the vertical direction to the optical axis of the electron ray, and the maximum focusing magnetic field to the primary electron ray is formed at nearly the same level as that of the objective lens. As a result, the strong focusing magnetic field to the sample surface can not be formed, and the spiral motion can not be given to the reflective electrons generated from the sample at a low angle. Also in the objective lens in this shape, since the distance between the sample and the lens main surface (focal length) becomes long, a problem exists in that an aberration of the primary electron ray becomes large.

Also in the technique disclosed in Japanese Patent Laid-open No. Hei 8-273569, in similar manner to the technique disclosed in Japanese Patent Laid-open No. Hei 9-171791, since the lens gap of the objective lens is opened toward the vertical direction to the optical axis, a problem exists in that the focal length of the primary electron ray becomes long. Also since the electrostatic objective lens is interposed between the lens main surface and the sample, a problem exists in that the short focal length of the objective lens can not be easily realized.

Specific means to solve the above-mentioned problems will be explained using drawings as follows.

In general, a reflective electron generated at a low angle to a sample (reflective electron generated at a high angle to the optical axis) brings a signal in which irregularity information of the sample and inner information of the sample are reflected. According to an apparatus as an embodiment of the present invention, a reflective electron generated at a low angle from the sample as above described can be detected efficiently.

FIG. 1 is a schematic diagram of an embodiment of the present invention showing an example of a scanning electron microscope adopting an objective lens in type that a sample is arranged between magnetic poles (hereinafter referred to as "in-lens") wherein two detecting means are arranged to the side of an electron source from the objective lens.

Figure 5:
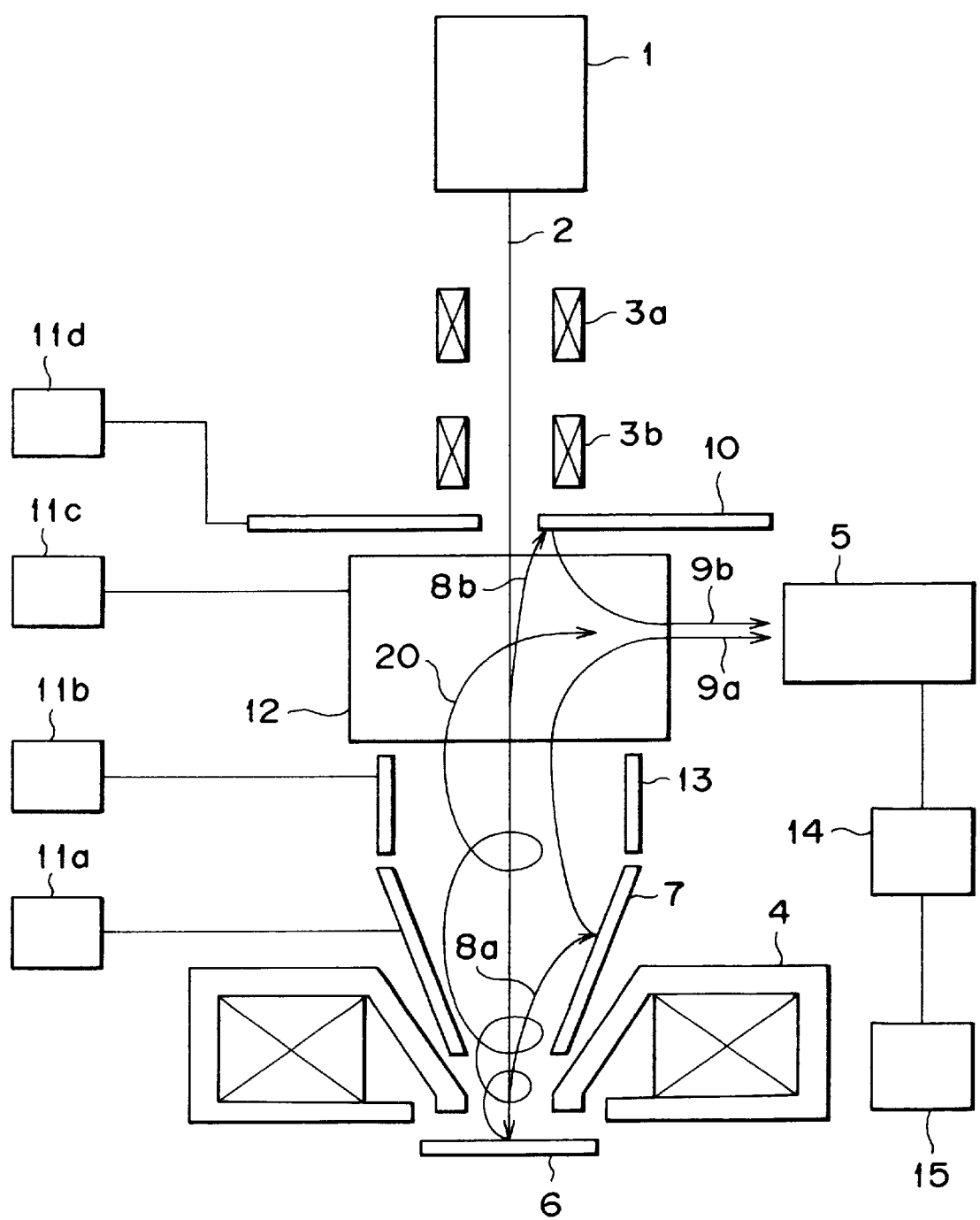
FIG. 5 is a schematic diagram of an embodiment of the invention showing a scanning electron microscope having an objective lens of lower magnetic pole open type.

In this embodiment, the objective lens of in-lens type is adopted, because this objective lens is favorable to form a strong focusing magnetic field on a surface of a sample. As another shape of an objective lens to form a strong focusing magnetic field on a surface of a sample, as shown in FIG. 5, an objective lens with a lens gap opened downward (hereinafter referred to as "lower magnetic pole open type lens") may be used. The lower magnetic pole open type lens is an objective lens where a gap between the upper magnetic pole and the lower magnetic pole (lens gap) is opened at least toward the sample surface. In the objective lens in such lens shape, the maximum focusing magnetic field to the primary electron ray is formed at the lower side from the lower magnetic pole.

In the objective lens of in-lens type and the objective lens of lower magnetic pole open type, since the distance between the sample and the lens main surface (focal length) can be shortened, the aberration of the primary electron ray can be reduced.

In the apparatus shown in FIG. 1, on a reflective electron detecting surface of a reflective electron detector (YAG), gold particles (heavy metal) of about several nanometers to several tens of nanometers are subjected to spatter coating.

Primary electron rays 2 generated from an electron source 1 are scanned by deflection coils 3a, 3b arranged in two stages and are focused onto a sample 6 by an objective lens 4. By irradiation of the primary electron beams 2, secondary electrons 20 and reflective electrons 8a, 8b1 are generated from the sample 6. Among the reflective electrons generated from the sample, the reflective electron 8a is a low-angle component generated at a low angle from the sample, and the reflective electron 8b is a high-angle component generated at a high angle from the sample. Such reflective electron generated at a high angle to the sample is a signal in which the composition information of the sample is reflected. In the apparatus as an embodiment of the present invention, two reflecting plates are installed so that not only the reflective electron generated at a low angle from the sample but also the reflective electron reflected toward the nearly optical axis direction can be detected.

The secondary electron 20 is raised to the electron source side and travels by the magnetic field produced by the objective lens 4. The secondary electron 20 is deflected to the side of a secondary electron detector 5a by a secondary electron deflector 12a and is detected by the secondary electron detector 5a.

On the other hand, the reflective electron 8a (low angle component) collides with a secondary electron conversion electrode 7 arranged at upper side of the objective lens 4, and generates a secondary electron 9a. The secondary electron 9a is led to the secondary electron deflector 12a by a raising electrode 13 to which the positive voltage is applied by a voltage applying means 11b, and then the secondary electron 9a is deflected by the secondary electron deflector 12a and detected by the secondary electron detector 5a.

In addition, in the apparatus of this embodiment, EXB deflector (orthogonal electromagnetic field generator) is used as the secondary electron deflectors 12a, 12b to deflect the secondary electrons to the secondary electron detectors 5a, 5b. The deflector comprises a pair of electrodes (not shown), and magnetic field generating means (not shown) for forming the magnetic field orthogonal to the electric field formed between the pair of the electrodes. The orthogonal electromagnetic field generator is disclosed, for example, in Japanese Patent Laid-open No. Hei 9-171791.

The reflective electron 8b1 (high angle component) is not so subjected to the deflecting function of the secondary electron deflector 12a but travels in straight line. The reflective electron 8b1 is deflected by the secondary electron deflector 12b arranged on upper side of the deflection coils 3a, 3b and collides with a gold particle spatter coating surface 17 on a surface of a reflection electron detector 18 (YAG).

In the spatter coating surface of a heavy metal such as gold, the secondary electron generating efficiency is high, and the reflective electron which can not pass through the coating surface is converted into a secondary electron thereby to enable to detect the electron.

Among the high angle component of the reflective electrons, an electron 8b2 with particularly high energy passes through the gold particle spatter coating surface 17 and is detected by the reflective electron detector 18. The reflective electron which can not pass through the gold particle spatter coating surface and is converted into a secondary electron 9b1 (electron with low energy among the high angle component), is detected by the secondary electron detector 5b. In this constitution, among the reflective electrons of high angle, the reflective electron with particularly high energy and the reflective electron with low energy can be detected in discrimination.

The positive voltage is applied to the secondary electron conversion electrode 7 by the voltage control means 11a, and the voltage (potential) of the raising electrode 13 is controlled so as to be lower than that of the secondary electron conversion electrode 7, whereby the secondary electron 9a generated by collision of the reflective electron 8a can not reach the secondary electron deflector 12a due to the electric field between the raising electrode 13 and secondary electron conversion electrode 7, and therefore the secondary electron 9a is not to be detected. Consequently while the detected state of the secondary electrons 20 is maintained, it is possible to select to detect the secondary electron 9a having the reflective electron information at a low angle from the sample or not to detect the secondary electron 9a.

In this case, the secondary electrons 20 generated from the sample rise substantially along the optical axis toward the electron source direction due to the function of the focusing magnetic field of the objective lens 4, whereby the secondary electrons 20 are not attracted by the secondary electron conversion electrode 7 but detected by the secondary electron detector 5a.

When the negative voltage is applied to the secondary electron conversion electrode 7 by the voltage control means 11a, the secondary electrons 20 generated from the sample 6 can not reach the secondary electron deflector 12a due to the negative potential of the secondary electron conversion electrode 7 so that the secondary electrons can not be detected by the secondary electron detector 5a.

Then if the potential of the raising electrode 13 is controlled to the value higher than the potential of the secondary electron conversion electrode 7, the secondary electron 9a generated from the secondary electron conversion electrode 7 reaches the secondary electron deflector 12a, and is deflected by the action of the secondary electron deflector 12a to be detected by the secondary electron detector 5a. Consequently the potential of the secondary electron conversion electrode 7 and the potential of the raising electrode 13 are individually controlled, whereby the selection becomes possible in that the secondary electron 20 from the sample and the secondary electron 9a having the information of reflective electron at a low angle are detected individually or detected in combination.

Among the reflective electrons, the low angle component includes the irregularity information of the sample surface and the high angle component includes the composition information of the sample surface respectively. Among the high angle component of the reflective electrons, the electron with high energy includes the composition information from the surface of the sample and the electron with low energy includes the composition information from the inside of the sample respectively.

Individual components of these reflective electrons are separated and detected selectively, whereby the sample image being high in the irregularity contrast and the composition contrast can be obtained. Thus the individual components of the secondary electrons and the reflective electrons are selectively detected in that the applied voltage is controlled by the voltage control means 11 so that the relative voltage difference is produced in the secondary electron conversion electrode 7, the raising electrode 13 and the secondary electron deflector 12 respectively. The detection signals of the secondary electrons 20 and the reflective electrons 8 are selected by the signal processing means 14 and combined or added with color to be displayed in the display 15.

The secondary electron conversion electrode 7 is formed in cylindrical shape having a passing port for the primary electron ray 2 and further an aperture at the electron source side becomes large. The inner surface of the cylindrical body becomes a secondary electron conversion surface.

The secondary electron conversion electrode 7 is formed in cylindrical shape so that the reflective electron 8a at a low angle spattering making a spiral orbit can be caught more securely.

In the secondary electron conversion electrode (reflecting plate) and the detector disclosed in Japanese Patent Laid-open No. Hei 9-171791 and Japanese Patent Laid-open No. Hei 8-273569, the secondary electron conversion surface and the detection surface are formed in the vertical direction to the optical axis of the electron ray. Thus the detection range becomes narrow for the reflective electron 8a at a low angle spattering making the spiral orbit. Also in order that these conversion surface and detection surface are formed large, diameter of a mirror cylinder of the electron microscope must be made large. However, it is substantially difficult to enlarge the space within the mirror cylinder of the electron microscope which must maintain the high vacuum state.

When the secondary electron conversion electrode is formed in cylindrical shape as in the embodiment of the present invention, the detection surface of the reflective electron at a low angle making the spiral orbit due to the influence of the focusing magnetic field of the objective lens can be enlarged, and the detection efficiency can be improved.

Also the aperture at the electron source side is formed large, so that the secondary electron 9a converted by the secondary electron conversion electrode 7 is readily led to the side of the secondary electron detector 5a.

Also in the apparatus of the embodiment of the present invention, the reflective electron collides with the secondary electron conversion electrode and is converted into a secondary electron so that the secondary electron is deflected to the secondary electron detector by the secondary electron deflector and is detected. The reason why the reflective electron is converted into the second electron and then is detected is in that if such strong electric field to deflect (attract) the reflective electron to the secondary electron deflector is given to the primary electron ray, the primary electron ray is subjected to the energy dispersion. In order to prevent the energy dispersion, the electron must be deflected (attracted) to the detector by a weak electric field.

Figure 2:
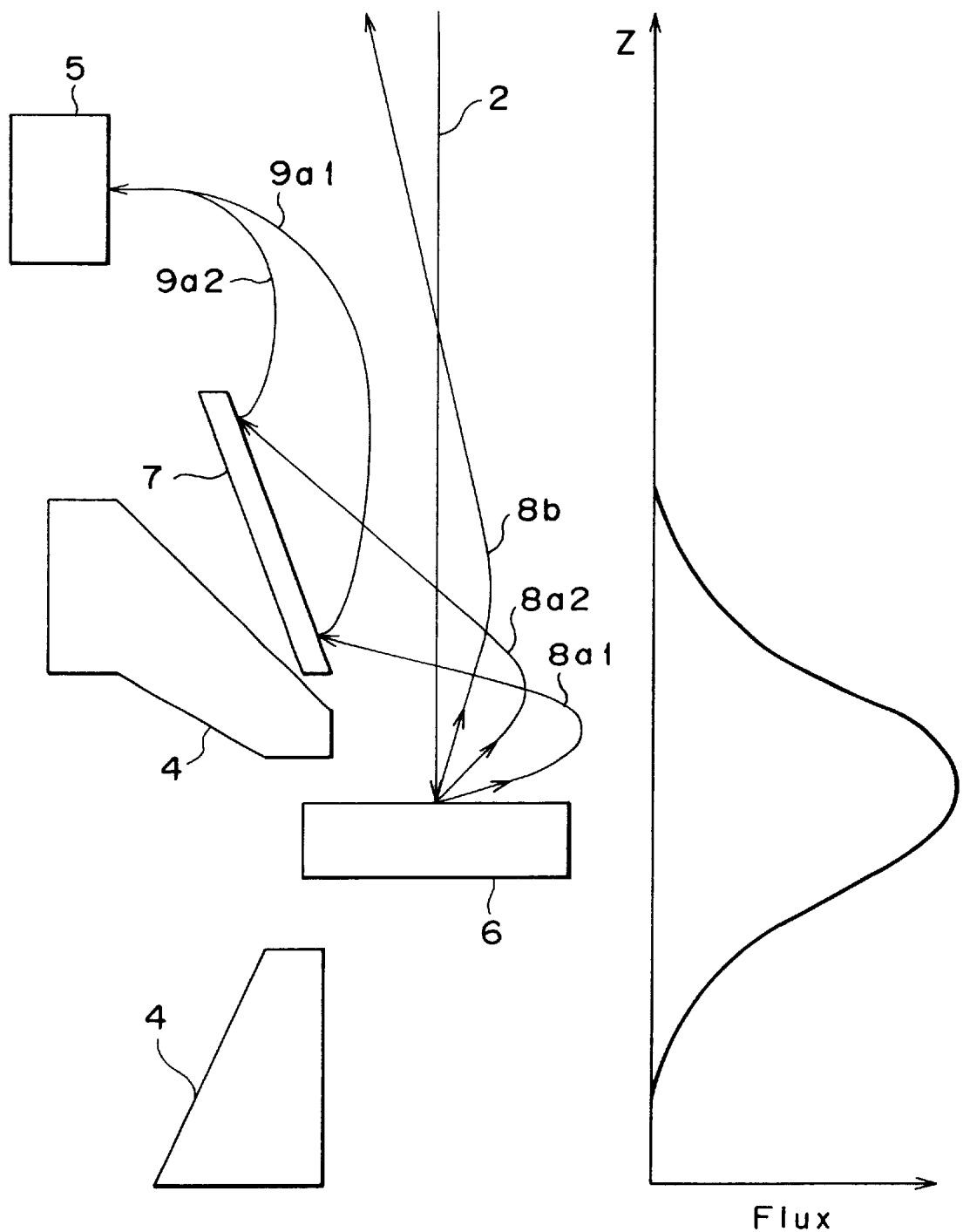
FIG. 2 is a schematic diagram showing an arrangement example of secondary electron conversion electrodes (conductive member).

FIG. 2 is a diagram showing an arrangement example of a secondary electron conversion electrode explaining the principle of the present invention more in detail.

Reflective electrons generated from a sample 6 by irradiation of a primary electron beam 2 have angular distribution, and orbits of the electrons are different depending on the electron generating angles. The reflective electron generated from the sample takes a spiral orbit under influence of the magnetic field of the objective lens and leaves the spiral orbit at a position where the influence of the magnetic field of the objective lens becomes little.

The reflective electron generated from the sample at a low angle (low angle component) leaves the spiral orbit, and then takes an orbit colliding with the magnetic field of the objective lens (reflective electron low-angle component 8a1) or another orbit greatly leaving the optical axis (reflective electron low-angle component 8a2). A secondary electron conversion electrode 7 is arranged on the orbit, whereby the low-angle reflective electrons 8a1, 8a2 are made secondary electrons 9a1, 9a2 generated by collision with the secondary electron conversion electrode and can be detected by the secondary electron detector 5. A high-angle reflective electron 8b generated from the sample at a high angle takes the orbit close to the optical axis even after affected by the magnetic field of the objective lens. Consequently such an electron is detected by detecting means arranged at still upper side of the secondary electron detector 5 as described later.

Figure 3:
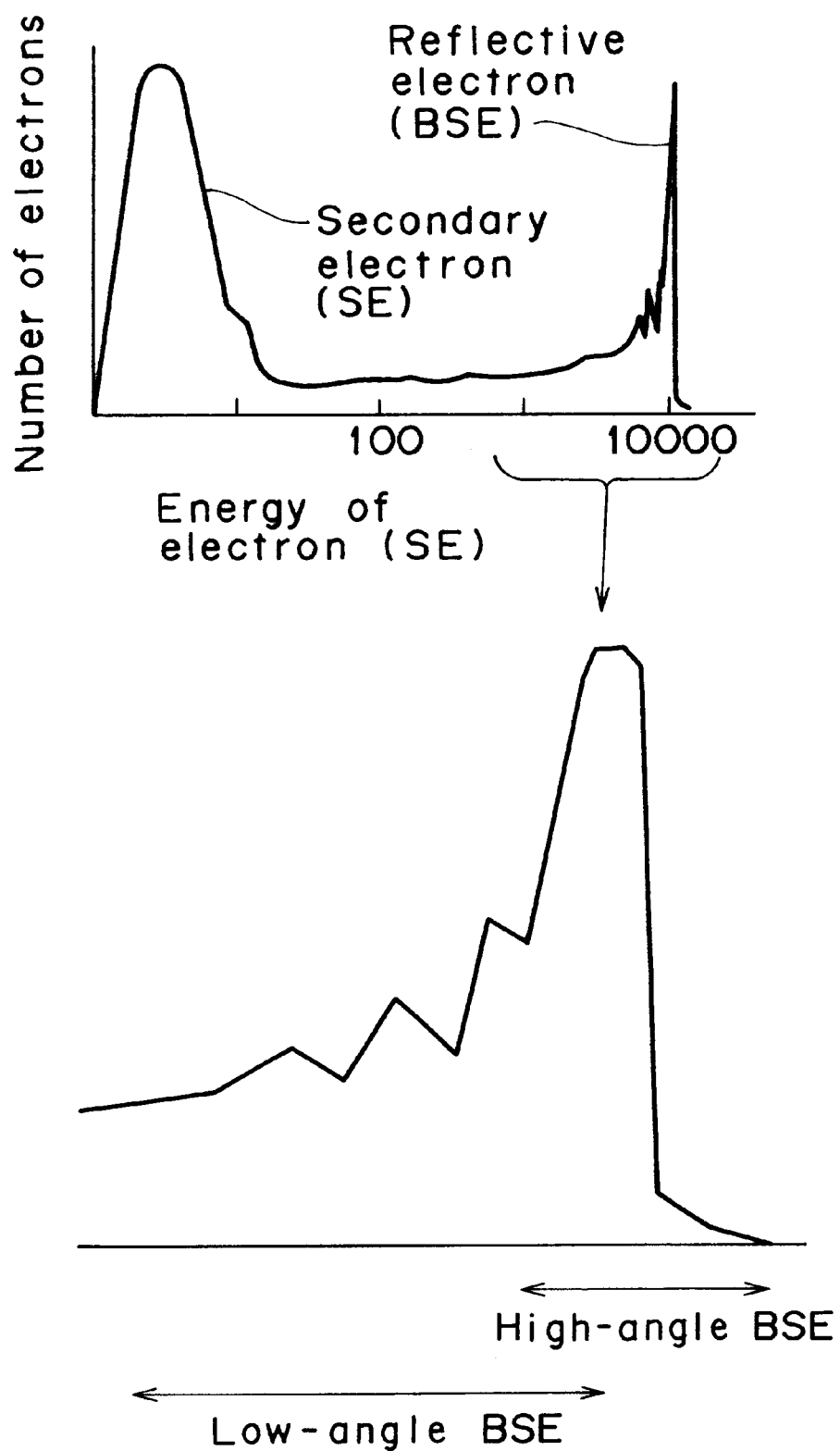
FIG. 3 is a diagram showing electrons generated from a sample and energy distribution of the electrons when a primary electron ray is irradiated.

FIG. 3 is a graph showing the number of electrons generated from the sample and energy distribution of the electrons when the primary electron ray is irradiated to the sample. Energy possessed by the reflective electron is high in comparison with that possessed by the secondary electron, and loss of the energy due to the collision with the sample is little. Among the reflective electrons, the high angle component has little loss and high energy band in comparison with the low angle component. These components are separated and detected selectively so that the irregularity information of the sample surface (included in the detection signal of the low angle component of the reflective electron) and the composition information of the sample surface (included in the detection signal of the high angle component of the reflective electron) can be obtained at high contrast.

Among the high angle component of the reflective electrons, that having high energy includes the information close to the sample surface. Thus the component with high energy and the component with low energy are separated and detected, whereby two sorts of the composition information, that from the surface of the sample and that from the inside, can be obtained at high contrast.

Figure 4:
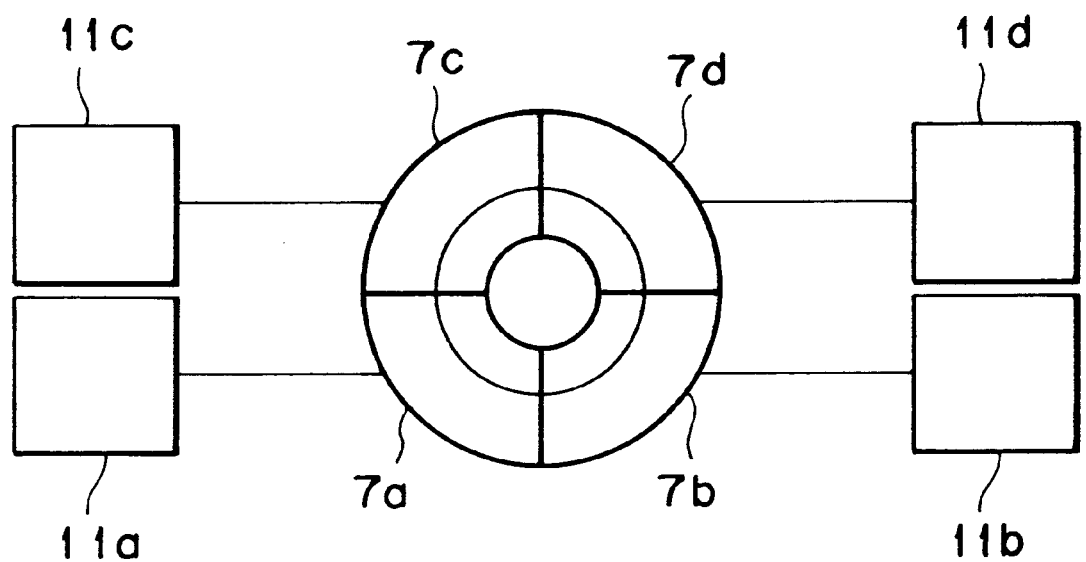
FIG. 4 is a schematic diagram showing an embodiment where the secondary electron conversion electrode is divided into plural parts.
Figure 4:
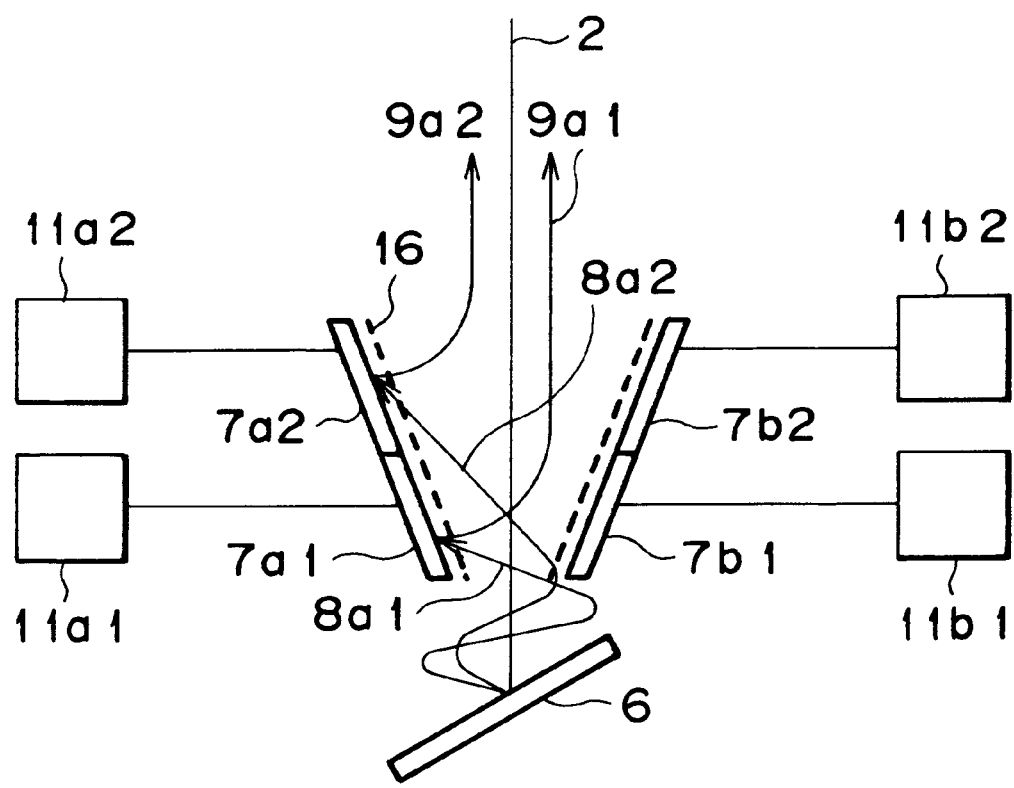

FIG. 4 shows an embodiment in which, while the secondary electron conversion electrode 7 (conductive member) is divided into plural parts, means for applying the voltage to the respective parts is arranged. Also in this embodiment, a mesh-shaped electrode 16 with electrons to be transmitted therethrough is arranged around the optical axis at the inside of the secondary electron conversion electrode 7.

Reflective electrons 8 (low angle component) generated from the sample 6 by irradiation of the primary electron ray 2 collide with the secondary electron conversion electrode 7 and generate secondary electrons 9. Then the generating angle distribution of the reflective electrons 8a (low angle component) varies depending on the irregularity and the slope of the sample, and also the collision position distribution on the secondary electron conversion electrode 7 varies. Therefore as in this embodiment, the secondary electron conversion electrode 7 is converted into plural parts (7a to 7d, 7a1 to 7a2), and the voltage of the secondary electron conversion electrode 7 is controlled relatively to the voltage of the electrode 16 by a voltage applying means 11. Thus the secondary electrons 9 generated on the secondary electron conversion electrode 7 due to the collision of the reflective electrons 8 can be introduced selectively, and the sample image with the irregularity or the slope emphasized can be obtained.

For example, in the secondary electron conversion electrode 7a1 and the secondary electron conversion electrode 7a2, in order to detect only the reflective electron 8a1 colliding with the secondary electron conversion electrode 7a1, the voltage applied to the secondary electron conversion electrode 7a2 is controlled higher than the voltage of the electrode 16 and the voltage of the secondary electron conversion electrode 7a1 is controlled lower than the voltage of the electrode 16 by the voltage control means 11.

The secondary electron 9a2 generated on the secondary electron conversion electrode 7a2 is not raised in the detector direction due to the relative potential and therefore is not detected. On the contrary, the secondary electron 9a1 generated on the secondary electron conversion electrode 7a1 is raised in the detector direction due to the relative potential difference (voltage of the secondary electron conversion electrode 7a1 is lower than the voltage of the electrode 16) and therefore is detected. Also the arrangement of the electrode 16 can prevent the state that when different voltages are applied to individual elements of the electrode 7, the deflecting electric field is generated on the optical axis.

FIG. 5 shows an embodiment where a secondary electron conversion electrode 10 is arranged to the side of an electron source 1 from a secondary electron deflector, and a reflective electron at a high angle is converted into a secondary electron and therefore is detected. A primary electron beam 2 generated from the electron source 1 is scanned by deflection coils 3a, 3b arranged in two stages and is focused onto a sample 6 by an objective lens 4.

By irradiation of the primary electron beam 2, secondary electrons 20 and reflective electrons 8a, 8b are generated from the sample 6. Among the reflective electrons generated from the sample, the reflective electron 8a is a low angle component generated from the sample at a low angle, and the reflective electron 8b is a high angle component generated from the sample at a high angle.

The secondary electron 20 is raised to the electron source side and travels by the magnetic field produced by the objective lens 4. The secondary electron 20 is then deflected to the side of the secondary electron detector 5 by the secondary electron deflector 12 and is detected by the secondary electron detector 5.

On the other hand, the reflective electron 8a (low angle component) collides with the secondary electron conversion electrode 7 arranged at the upper side of the objective lens 4 and generates a secondary electron 9a. The secondary electron 9a is led to the secondary electron deflector 12 by a raising electrode 13 to which the positive voltage is applied by a voltage applying means 11b. The secondary electron 9a is then deflected by the secondary electron deflector 12 and detected by the secondary electron detector 5. The reflective electron 8b (high angle component) collides with the secondary electron conversion electrode 10 arranged at the upper side of the secondary electron deflector 12 and also generates a secondary electron 9b. The secondary electron 9b is deflected by the secondary electron deflector 12 and is detected by the secondary electron detector 5.

Here, if the positive voltage is applied to the secondary electron conversion electrode 7 by the voltage control means 11a and the voltage (potential) of the raising electrode 13 is controlled to a value lower than the voltage (potential) of the secondary electron conversion electrode 7, the secondary electron 9a generated due to the collision of the reflective electron 8a can not reach the secondary electron deflector 12 by the function of the electric field between the raising electrode 13 and the secondary electron conversion electrode 7 and therefore can not be detected. Thus the state of the secondary electron 20 to be detected is maintained, and selection can be performed regarding whether the secondary electron 9a having the low-angle reflective electron information from the sample should be detected or not.

On the other hand, if the negative voltage is applied to the secondary electron conversion electrode 7 by the voltage control means 11a, the secondary electron 20 generated from the sample 6 can not reach the secondary electron deflector 12 due to the negative potential of the secondary electron conversion electrode 7 and therefore can not be detected by the secondary electron detector 5. Thus if the potential of the raising electrode 13 is controlled to a value higher than the potential of the secondary electron conversion electrode 7, the secondary electron 9a generated from the secondary electron conversion electrode 7 can reach the secondary electron deflector 12 and is deflected by the function of the secondary electron deflector 12 to be detected by the secondary electron detector 5. Consequently if the potential of the secondary electron conversion electrode 7 and the potential of the raising electrode 13 are controlled individually, selection becomes possible regarding the secondary electron 20 from the sample 6 and the secondary electron 9a having the lowangle reflective electron information are detected individually or detected in combination.

Also if the positive voltage is applied to the secondary electron conversion electrode 10 by the voltage control means lid, the secondary electron 9b generated due to the collision of the reflective electron 8b can not reach the secondary electron deflector 12 due to the function of the electric field and therefore can not be detected. Consequently the secondary electron 20 and the secondary electron 9a can be detected in discrimination. The secondary electron conversion electrode 10 may be constructed to be advanced or retracted from the outside. If the high-angle reflective electron information is not necessary, the secondary electron conversion electrode 10 is drawn away from the optical axis so that the reflective electron does not collide. Thus the high-angle reflective electron information can be selected. In this case, the voltage of the secondary electron conversion electrode 10 need not be controlled.

Thus voltages to be applied to the secondary electron conversion electrode 7, the raising electrode 13, the secondary electron deflector 12 and the secondary electron conversion electrode 10 respectively are controlled by the voltage control means 11 so that relative voltage differences are produced respectively. The secondary electron detected by the secondary electron detector 5 is converted into an electric signal and then passes through signal processing means 14 and is displayed in a display 15.

According to the apparatuses of the embodiments in the present invention, the reflective electron at a high angle, the reflective electron at a low angle or the secondary electron can be detected selectively, and a sample image can be formed based on the detected image. Further a sample image can also be formed by combining these two or more electrons.

According to the apparatuses of the embodiments in the present invention as above described, the reflective electrons can be selected depending on the generating angle and the energy without lengthening the focal length, and the information can be obtained in discrimination in the composition information, the shape information or the like.

What is claimed is:

1. A scanning electron microscope which obtains a two-dimensional scan image of a sample, comprising:
   an electron source;
   a scan deflector for scanning a primary electron ray generated from said electron source onto the sample;
   an objective lens shaped and disposed so as to form a focusing magnetic field, which surrounds said sample, onto said sample, said focusing magnetic field focusing said primary electron ray; and
   a secondary signal detector for deflecting and detecting a secondary signal generated from said sample by irradiation of said primary electron ray;
   wherein a secondary electron conversion electrode for generating secondary electrons by collision of electrons disposed between said objective lens and said detector at a location that is closer to the electron source than said objective lens is and at a location that is closer to the sample than said secondary signal detector is.

2. A scanning electron microscope as claimed in claim 1, wherein said secondary electron conversion electrode is a cylindrical body having an aperture allowing said primary electron ray to pass therethrough.

3. A scanning electron microscope as claimed in claim 2, wherein the said cylindrical body has an aperture formed largely at the electron source side.

4. A scanning electron microscope as claimed in claim 2, wherein said cylindrical body is divided into at least two or more electrodes in one of or more of a direction of the optical axis of said primary electron ray and a direction orthogonal to said optical axis.

5. A scanning electron microscope as claimed in claim 4, wherein voltage applying means are connected to the individual electrodes forming the cylindrical body, respectively.

6. A scanning electron microscope as claimed in claim 1, wherein said secondary signal detector is provided with a secondary electron deflector which forms an electric field to deflect said secondary signal to said secondary electron detector.

7. A scanning electron microscope as claimed in claim 1, wherein a secondary electron raising electrode is arranged at a location that is closer to the electron source than said secondary electron conversion electrode is and at a location that is closer to the sample side than said secondary signal detector is.

8. A scanning electron microscope as claimed in claim 1, further comprising means for applying positive or negative voltage to said secondary electron conversion electrode.

9. A scanning electron microscope as claimed in claim 1, further comprising: an electrode arranged at a location that is closer tot he electron source than said secondary electron conversion electrode is and at a location that is closer to the electron source than said secondary signal detector is; and voltage applying means for applying a positive voltage to said electrode and said secondary electron conversation electrode; wherein said voltage applying means applies voltage to said secondary electron conversion electrode, said voltage being larger than the voltage applied to said former electrode.

10. A scanning electron microscope as claimed in claim 1, further comprising; a porous electrode arranged between said secondary electron conversion electrode and the optical axis of said primary electron ray; and voltage applying means for applying voltage to said porous electrode and said secondary electron conversion electrode.

11. A scanning electron microscope as claimed in claim 10, wherein said secondary electron conversion electrode and said porous electrode are a cylindrical body having an aperture allowing said primary electron ray to pass therethrough.

12. A scanning electron microscope as claimed in claim 11, wherein said cylindrical body has an aperture formed largely at said electron source side.

13. A scanning electron microscope which obtains a two-dimensional scan image of a sample, comprising:

an electron source;

a scan deflector for scanning a primary electron ray generated from said electron source onto the sample;

an objective lens having an upper magnetic pole and a lower magnetic pole, said sample arranged between the upper and lower magnetic poles with said objective lens forming a focusing magnetic field, which surrounds said sample, onto said sample; and a secondary signal detector for detecting a secondary signal generated from the sample by irradiation of the primary electron ray;

wherein an electrode for generating secondary electrons by collision of reflective electrons is arranged between said objective lens and said secondary electron detector.

14. A scanning electron microscope which obtains a two-dimensional scan image of a sample, comprising:

an electron source;

a scan deflector for scanning a primary electron ray generated from said electron source onto said sample;

an objective lens having an upper magnetic pole and a lower magnetic pole, a gap between said upper magnetic pole and said lower magnetic pole being opened toward the sample surface such as to generate a focusing magnetic field which surrounds said sample; and a secondary signal detector for detecting a secondary signal generated from the sample by irradiation of the primary electron ray;

wherein an electrode for generating secondary electrons by collision of reflective electrons is arranged between said objective lens and said secondary electron detector.

* * * * *